United States Patent [19]

Cobaugh et al.

[11] 4,077,688

[45] Mar. 7, 1978

[54] ZERO FORCE CONNECTOR FOR CIRCUIT BOARDS

[75] Inventors: Robert Franklin Cobaugh, Elizabethtown; James Ray Coller, Mechanicsburg, both of Pa.

[73] Assignee: AMP Incorporated, Harrisburg, Pa.

[21] Appl. No.: 730,880

[22] Filed: Oct. 8, 1976

Related U.S. Application Data

[63] Continuation of Ser. No. 560,856, Mar. 21, 1975, abandoned.

[51] Int. Cl.[2] ........................ H01R 13/62; H05K 1/07

[52] U.S. Cl. ........................ 339/74 R

[58] Field of Search .................. 339/74, 75, 176, 17 L

[56] References Cited

U.S. PATENT DOCUMENTS

| | | | |
|---|---|---|---|
| 3,464,054 | 8/1969 | Mansfield | 339/176 MP |
| 3,594,699 | 7/1971 | Jayne et al. | 339/176 MP |
| 3,596,230 | 7/1971 | Ecker | 339/74 R |
| 3,665,370 | 5/1972 | Hartmann | 339/75 MP |
| 3,897,991 | 8/1975 | Pritulsky | 339/75 MP |
| 3,963,293 | 1/1976 | McKee | 339/176 MP |
| 3,990,761 | 11/1976 | Jayne | 339/74 R |

*Primary Examiner*—Roy Lake
*Assistant Examiner*—Neil Abrams
*Attorney, Agent, or Firm*—Donald W. Phillion

[57] ABSTRACT

A printed circuit board connector is comprised of an elongated rectangular housing having a passageway in a longitudinal edge thereof for insertion of the board. A thin plate lever lying along the outer surface of each side wall of the housing and rockably mounted thereon, is provided at its free end with openings to capture the free ends of resilient contact members supported within the housing for retracting them against their bias from the path of a circuit board inserted in the passageway. A thin slidable cam plate between each of the side walls and plate levers cooperates with projections on the walls for causing them to move outward for pulling the contacts away from the passageway. A feature of the invention is that the housing and plate levers are all injection molded in one piece, and the levers are broken off the housing and rockably mounted thereon. The cooperating parts on the levers and side walls by which they can be assembled for relative rocking movement of the levers are integrally formed thereon in the molding process.

29 Claims, 9 Drawing Figures

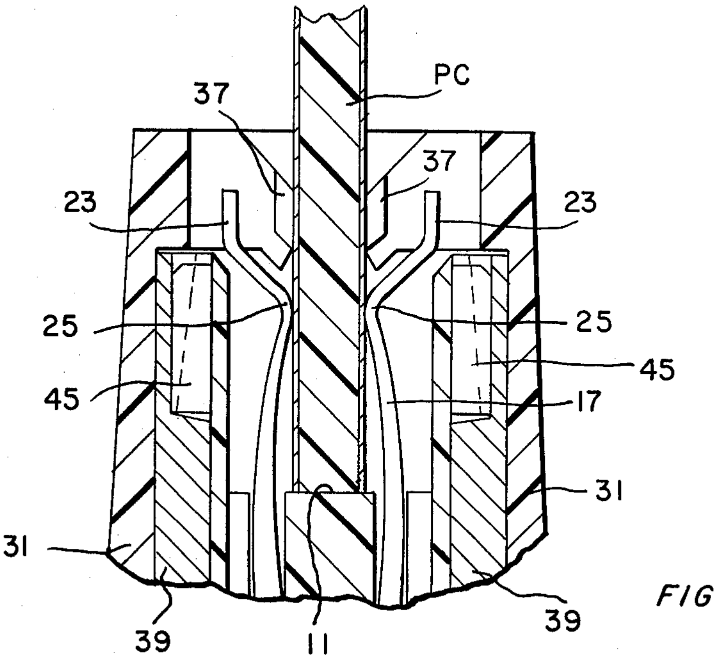
FIG 5
FIG. 7a
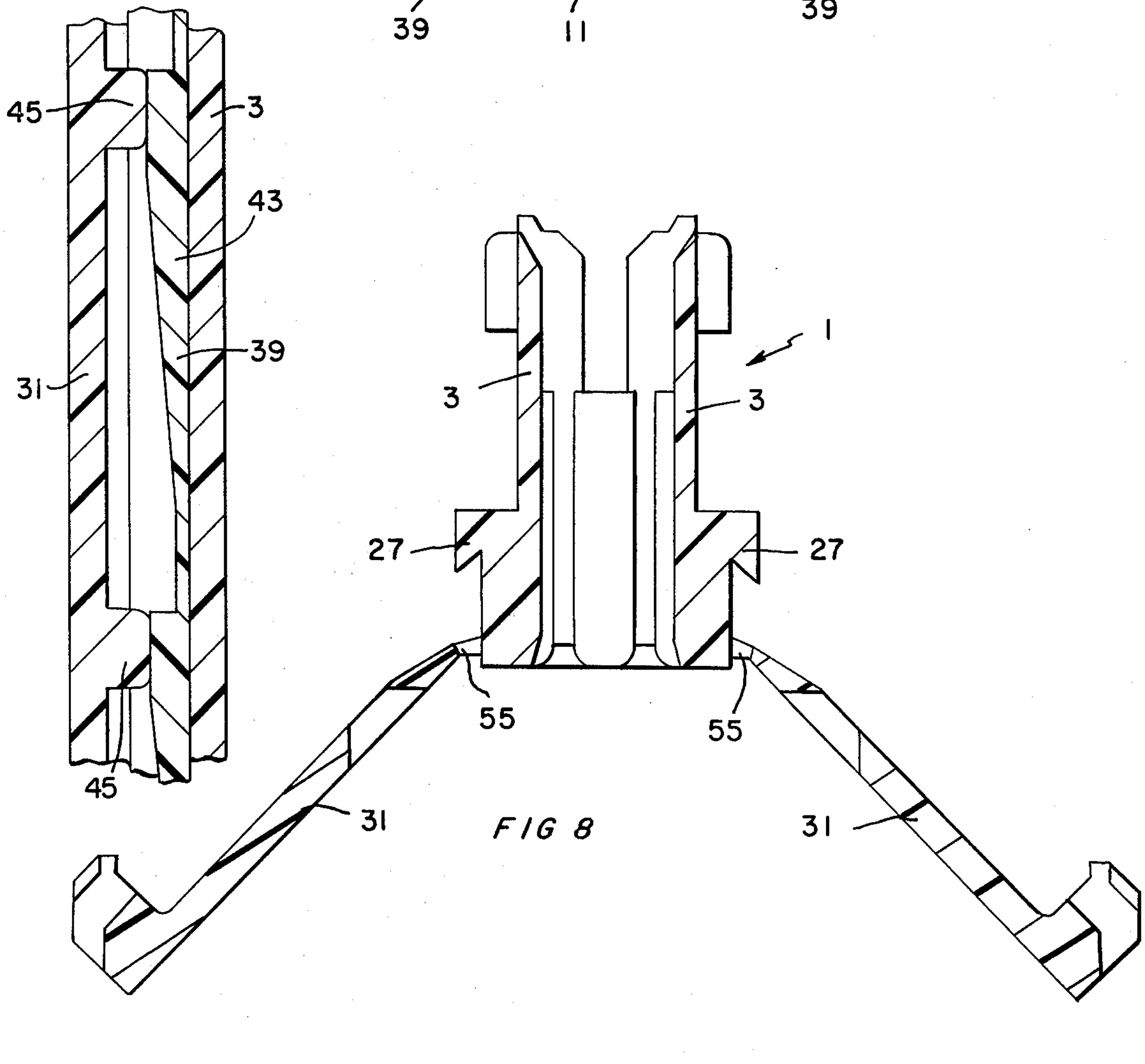
FIG 8

ZERO FORCE CONNECTOR FOR CIRCUIT BOARDS

CROSS-REFERENCE TO RELATED APPLICATION

The present application is a continuation of now abandoned application Ser. No. 560,856 filed Mar. 21, 1975, by Robert Franklin Cobaugh and James Ray Coller and entitled "Zero Force Connector For Circuit Boards".

BACKGROUND OF THE INVENTION

This invention relates generally to connectors for use with printed circuit boards which are provided with contacts adjacent an edge thereof, the connectors each having a slot for receiving the edge portion of the board and being provided with resilient contact members within the slot to engage the contacts on the boards, the contact members having terminals external to the housing. In order to provide for zero force insertion and removal of a board within the slot, provisions have been made in the prior art for moving the contact members away from the passageway provided by the slot in the connector to permit free passage of the board into and out of the slot. After the board has been inserted within the slot, the contacts are returned toward the slot to engage the contacts on the board. The above described zero force insertion and withdrawal connectors usually have some type of cam or lever arrangement which acts upon the contacts to force them into/or out of engagement with the contacts of the board within the passageway.

Such mechanisms for moving the contacts are generally quite complex and usually large thus making the connector bulky. Where a number of connectors are mounted in side-by-side relation to receive a number of circuit boards, they would thus have to be spaced far apart due to their bulkiness and to permit space for manipulating the mechanism. However, it is highly desirable in large installations and in modern day electronic packaging to space the boards closely together to provide as small a package as can be conveniently provided.

BRIEF STATEMENT OF THE INVENTION

It is therefore a primary object of this invention to provide a zero force insertion and withdrawal connector for a circuit board which is of small dimensions.

Another object of the invention is to provide a circuit board connector having zero force insertion and withdrawal capabilities in which the operating means for moving the contact members are thin substantially planar elements lying close against the side walls of the connector.

A further object of the invention is to provide a connector board of the above type using a lever of the third class operated by a thin slidable plate cam for displacing the contact members of the connector from the path of insertion of the board.

A still further object of the invention is to produce a housing for the above type of connector, in which the lever arms for controlling the movement of the connectors are molded integrally with the housing and broken off therefrom for assembly thereto.

A still another object of the invention is to provide a circuit board connector which has a fewer number of parts, can be easily produced and which is more economical to assemble.

Other objects will become obvious as a description of the invention proceeds.

In accordance with this invention, a connector for connection to a printed circuit board is comprised of a one piece molded plastic rectangular housing having a pair of opposed side walls connected together at their ends and their inner walls bridged by partitions extending from top to bottom thereof. The partitions have their upper ends notched intermediate of the side walls, the notches being in alignment to form a passageway for receiving the edge of a printed circuit board therein. A plurality of elongated spring contacts are frictionally anchored intermediate their ends in the respective spaces between the partitions and on each side of the passageway, opposite contacts being normally biased toward each other. A plate lever is rockably mounted on the outer surface of each side wall and is provided at its upper end with means for capturing the upper ends of the spring contacts to retract them from the passageway against their bias. A flat plate cam is slidably mounted between each side wall and plate lever to bear against a fixed protuberance on either the wall or plate lever to cause the latter to rock toward and away from the side wall to move its upper end to control the position of the contacts relative to the passageways. The opposite free ends of the spring contacts extend through and are frictionally anchored in respective apertures in a separate plastic strip extending along the bottom of the housing and form terminals for connection to external circuit means.

The housing, including the side and end walls, partitions and plate levers can be made in one piece by injection molding, the plate levers then being broken away from the housing to which they are attached in the molding process, and then rockably mounted on the side walls of the housing by interengaging parts integral therewith.

BRIEF DESCRIPTION OF THE DRAWINGS

FIG. 5 is a cross-sectional view similar to FIG. 3 with the circuit board inserted in the connector and engaged by the contacts;

FIG. 7*a* shows an alternative form of the camming arrangement for pulling the contacts away from each other; and FIG. 8 is a transverse sectional view of the integrally molded connector housing and plate levers before the latter have been removed by breaking them off.

DETAILED DESCRIPTION OF THE INVENTION

Figure 7:
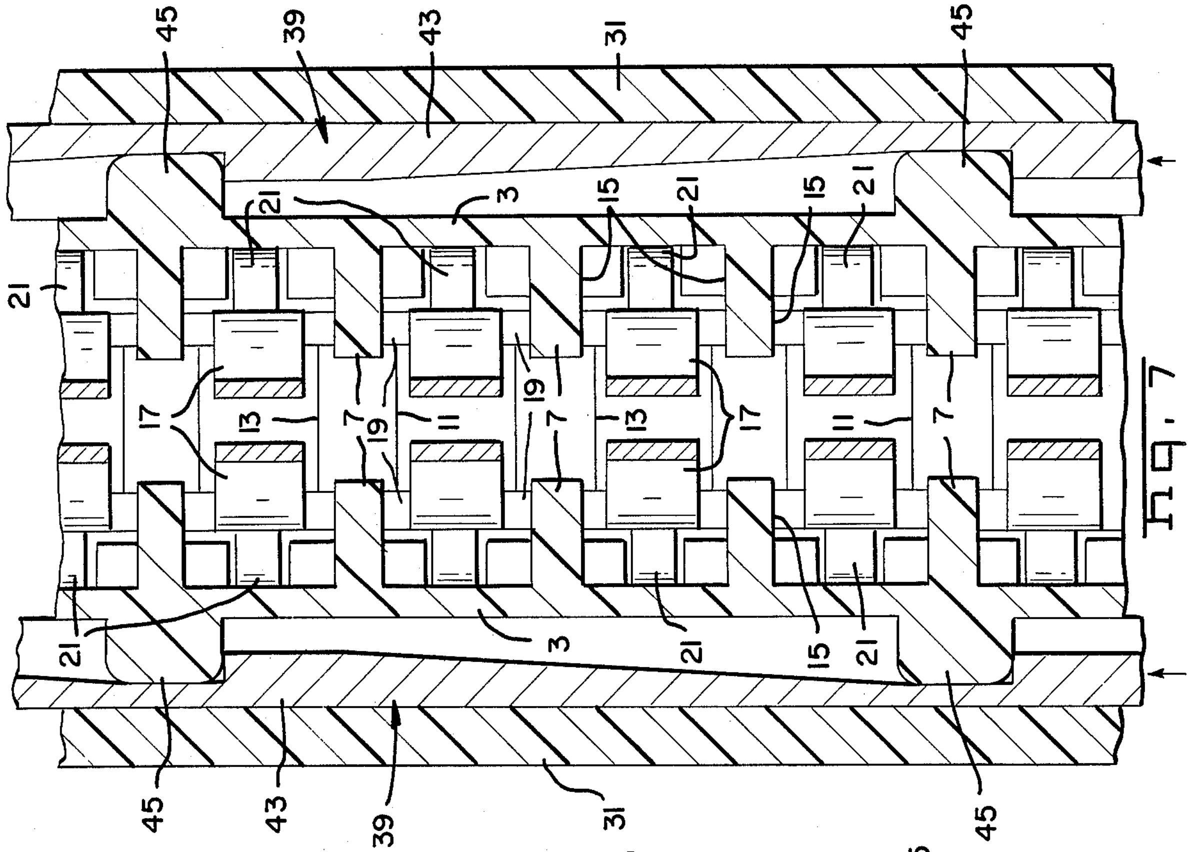
FIG. 7 is a cross-sectional view taken along line 7—7 of FIG. 3 showing the arrangement of the parts when the contacts have been released to return to their positions within the passageways.
Figure 6:
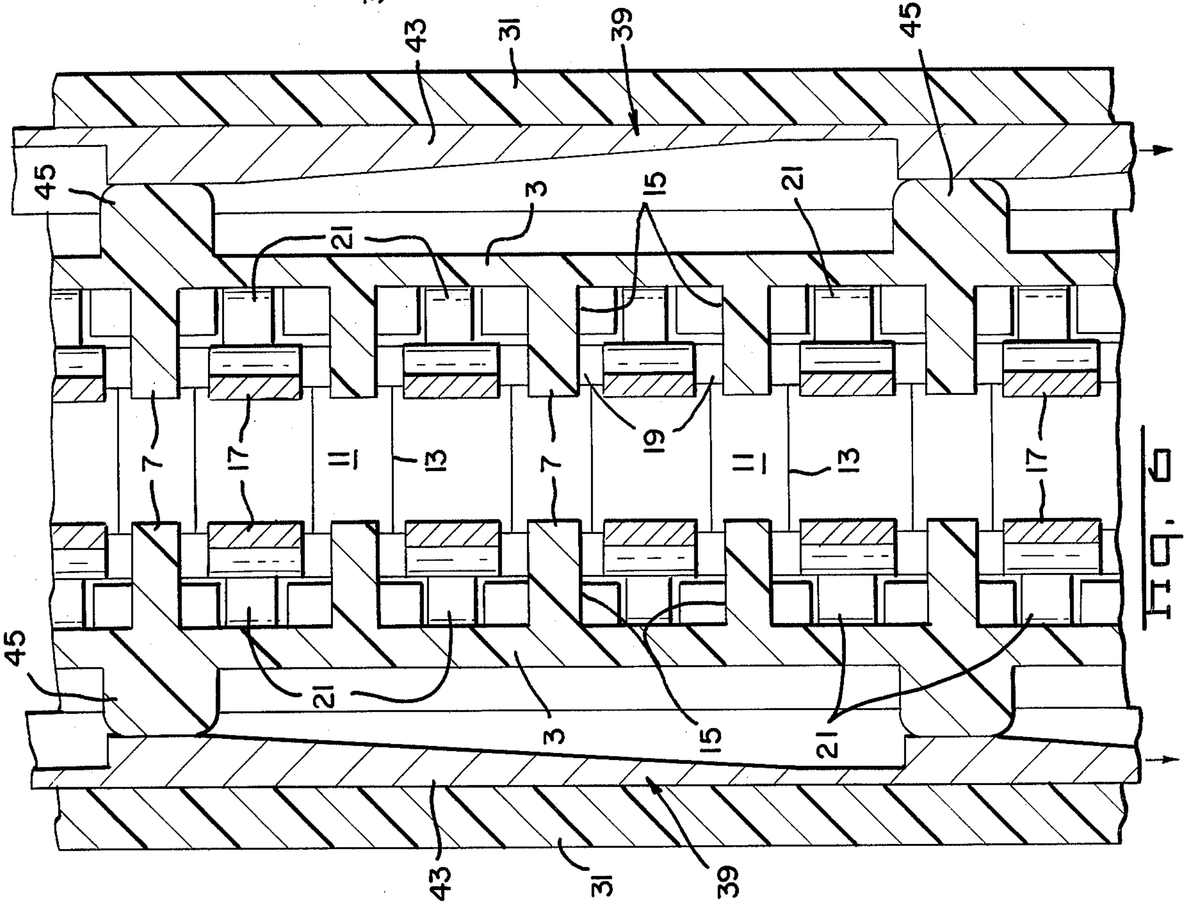
FIG. 6 is a cross-section view taken along line 6—6 of FIG. 2 showing the arrangement of the parts with opposed contacts pulled away from each other.

With specific reference to the Figs. of the drawing, the housing 1 is molded in one piece of a hard plastic material, substantially of rectangular shape with spaced side walls 3 and end walls 5, only one of which is shown. Between the side walls of the housing and integrally formed therewith there extends a plurality of longitudinally spaced partitions 7 as best seen in FIGS. 6 and 7. The partitions are each centrally recessed at their upper ends to a predetermined depth to form a vertical notch 9 providing a passageway for the insertion therein of a circuit board PC, the bottom wall of the notch forming a seat 11 for supporting the lower edge of the inserted board. Both surfaces of each partition wall 7 is provided with a vertical groove 15 on both sides of the seat 11, as shown in FIGS. 6 and 7. A spring contact member 17 having an intermediate portion 19 of a laterally enlarged dimension as compared to that shown in cross-section in FIG. 6, is frictionally maintained in each groove by contact of its sides with the bottom walls of the grooves of opposite partition walls. The face of its laterally enlarged dimension is also in contact with a side wall of the groove under bias of a struck-up resilient tongue 21 abutting the inner surface of the side wall of the housing. The upper portion 23 of each contact member extends vertically beyond the upper end of the partition 7, then curves inwardly into the passageway 9 and then reversely to provide a contact portion 25. The contact portions 25 of the spring members 17 located on directly opposite sides of the passageway 9 normally lie in closely spaced relation therewithin since the contacts are resiliently biased toward each other.

Figure 3:
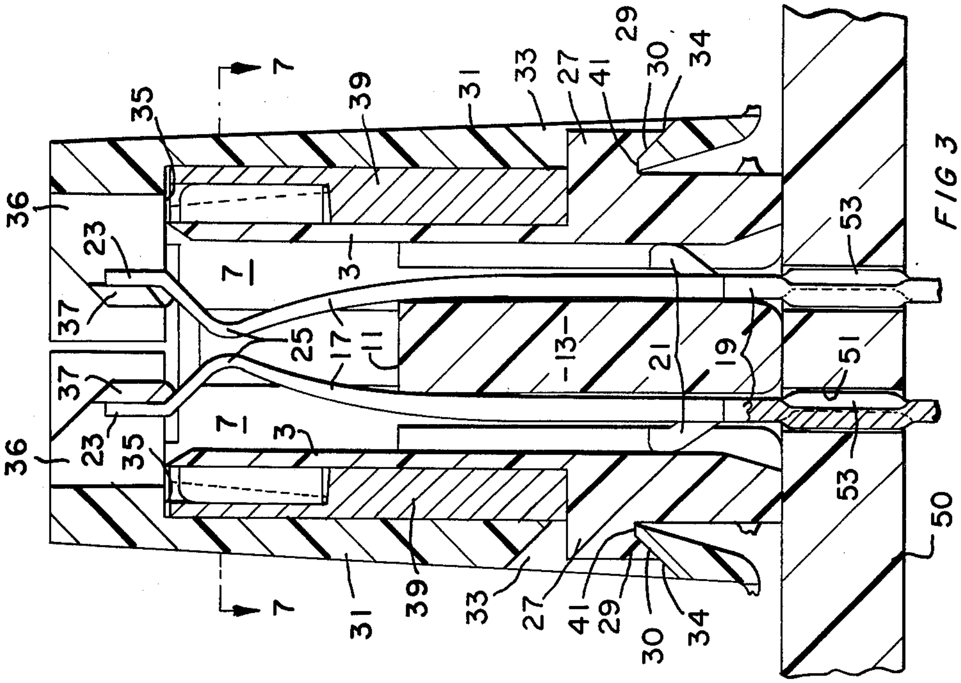
FIG. 3 is a transverse cross-sectional view similar to FIG. 3 showing the parts of the connector operated to permit return of the contacts into the passageway.
Figure 2:
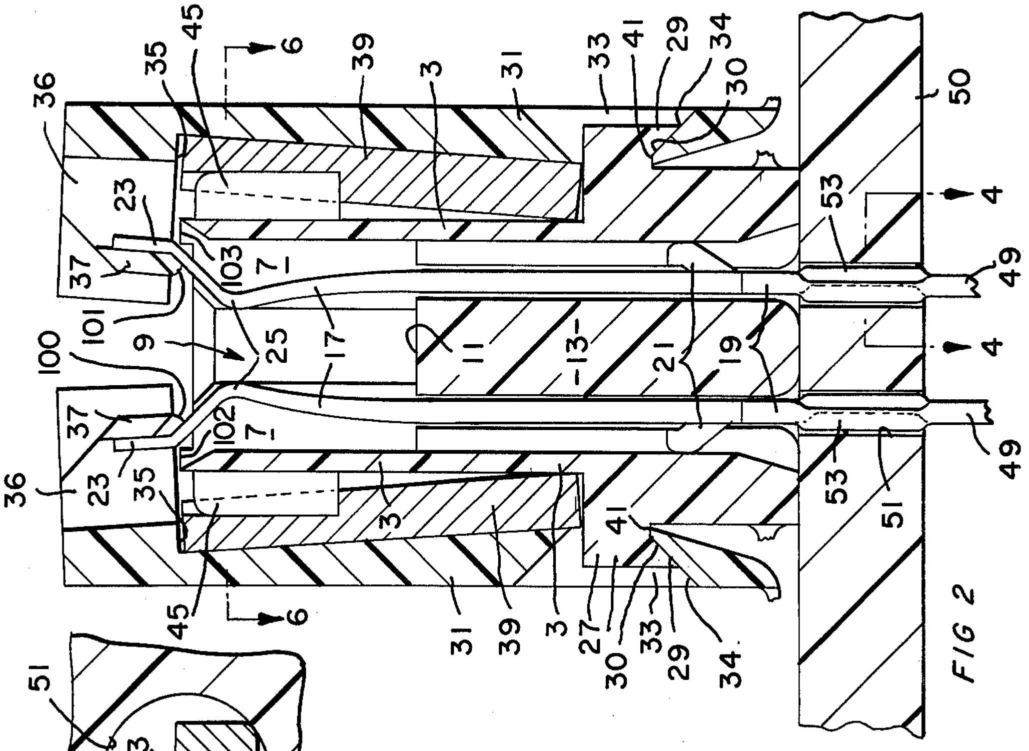
FIG. 2 is a transverse cross-sectional view of the connector assembly with the parts operated to space the contacts away from the passageway for insertion or withdrawal of the board.
Figure 4:
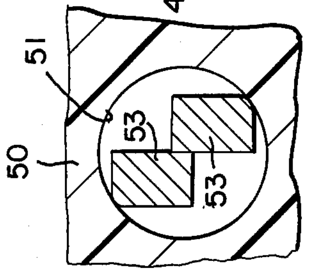
FIG. 4 is a cross-sectional view taken along line 4—4 of FIG. 2 showing the shape of that portion of the terminal of the contact member which is anchored in an auxiliary panel.

The side walls 3 of the housing, are each provided adjacent their lower ends with a plurality of longitudinally spaced outwardly extending ledges 27 each having a depending edge wall 29. The rear surface 30 of the depending edge wall slants upwardly back toward the lower surface of the ledge 27 as shown in FIGS. 2 and 3. In effect, the lower surfaces of the ledge may be considered as having a groove therein. In order to pull the opposite contacts 25 apart to provide a free passageway for a circuit board to be inserted therein, a lever 31 is rockably mounted by means of the ledges 27 on each side wall and is provided with openings at its upper end for receiving the free ends of the contact members. The lever 31, hereinafter designated as a plate lever or a plate means is in effect, a thin plate member provided with openings 33 adjacent its lower end to pass over each of the ledges including the depending edge wall 29. The lower wall 34 of each opening 33 is slanted in the same direction as the inner surface 30 of the depending edge wall 29. Projecting from each plate lever adjacent its upper end and overlying the upper end of the housing is a narrow ledge 35 having extensions in the form of a plurality of longitudinally spaced parallel wall members 36. The free ends of the wall members are provided with bilateral extensions 37. The free ends 23 of the contact members 17 respectively, extend into the spaces between the wall members 36 and engage the bilateral extensions 37 to normally bias the plate lever against the side wall on which it is mounted while locating the contact member within the passageway 9.

Figure 1:
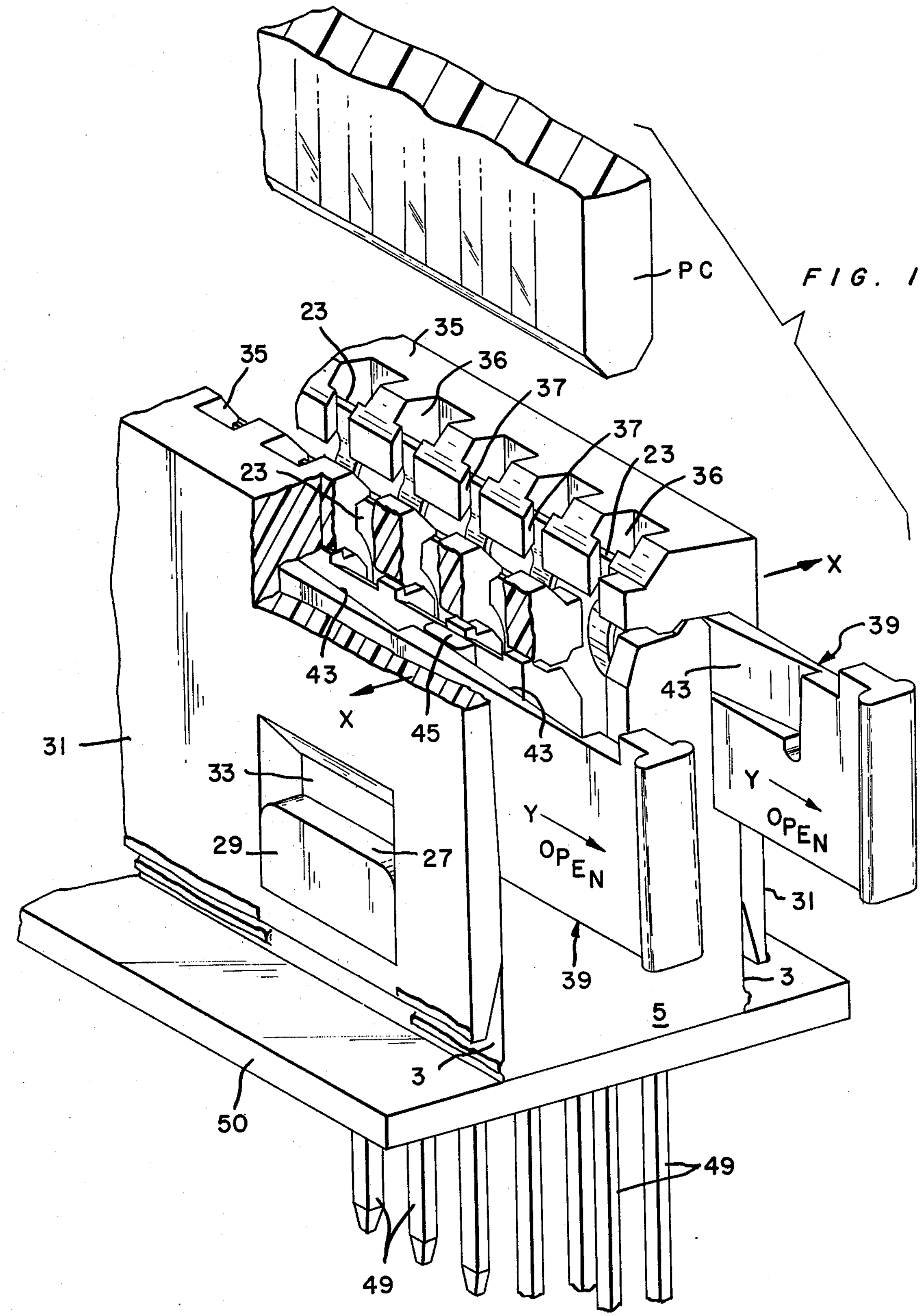
FIG. 1 shows in perspective a portion of the housing with the contact members, the cam and lever plates in assembled relation.

In order to both maintain each of the plate levers 31 in assembled relation to its side wall 3 and to control movements of the plate lever toward and from the side wall, there is provided a substantially rectangular cam plate 39, also referred to herein as an actuator means. Each cam plate is slidably supported on the ledges 27 for longitudinal movements thereon between the side wall and plate lever 31 and its height extends to adjacent the narrow ledge 35 on the plate lever 31. As clearly seen in FIGS. 2 and 3, the upper edge 41 of slanting wall 34 of the opening 33 will fulcrum on the lower surface of the ledge 27 for rocking movements thereon and be maintained in operatively assembled relation therewith by the plate cam 39. The surface of the upper marginal end portion of each plate cam which faces the side wall 3, has a plurality of sections such as 43, which taper in thickness longitudinally at the same rate thus forming a plurality of inclined planes. Fixed on each of the side walls 3 are a plurality of protuberances 45 which the inclined planes of the plate cam abut when the latter is moved longitudinally. As shown in FIG. 1, when the plate cam is moved in the direction of the arrow Y, the thickness of the section 43 presented to the protuberance increases, so that the plate cam 39 is canted about its lower outer corner 38 to force the upper portion of plate lever 31 outwardly in the direction of the arrow X, to in turn pull the upper ends of the contact spring 17 away from the passageway against their bias, as clearly seen in FIGS. 2 and 6 to retract the contacts from the passageway. By moving the plate cam in the opposite direction, the pull on the free ends 23 of the contact springs is gradually relieved to permit the two rows of contacts 25 to approach each other, as in FIGS. 3 and 7. Obviously, a stop may be affixed to the portion of the plate cam protruding from the opposite end of the housing from that shown in FIG. 1 to limit slidable movement thereof to the length of one inclined plane or cam section. The protuberances 45 may be located instead on the inner surface of plate lever 31, in which case the plate cam must be turned around to permit its cam surfaces to shut the protuberances. In FIG. *7a* the cam surface of thickness section 43 of plate cam 39 is shown facing the inner surface of plate lever 31, which has the protuberances 45 formed thereon. Other combinations of inclined planes and/or protuberances on the surfaces of the plate means 31, and other type camming means, will be readily apparent to those skilled in the art.

The spring contact members 17 located within the housing are of generally flat leaf-spring form and have terminals 49 opposite to end portions 22 and which extend from the opposite end of the housing. These terminals have thin narrow dimensions. A separate rigid plastic strip 50, which can be a substrate such as a printed circuit board, having openings 51 therein through which the terminals end portions may extend, is located against the lower end of the housing and is maintained thereagainst by frictional force against the walls of the openings of an enlarged portion 53 of the terminals which is formed adjacent the enlargement 19 of the contact member. The walls of the openings 51 in the plastic strip may be metallized to avoid possible enlargement of the openings by the enlarged portion 53 of the terminals when forced thereinto.

The one piece plastic housing 1 of the connector can be produced by injection molding simultaneously with the plate levers 31 which are later broken off at the attenuated web portion 55. As can be clearly seen from the Figure, all of the parts of the connector except the spring contact members 17 and the plate cam 39, which may be of metal, are provided by the one molding step. In assembling the connector, the spring contact members 17 are first mounted on the strip 50 in two opposed rows by inserting the terminal portion 49 into the respective openings in the strip and forcing them down until their enlarged portions 53 are tightly held therein by friction. The contact members are so oriented on the strip that the contacts 25 of the two rows face each other. The plate levers 31 are then removed from the main body of the housing by breaking them off at their attaching frangible web portion 55. Next the cams 39 are inserted into the housing. The plate levers are then mounted on the respective side walls 3 of the housing passing their openings 33 over the ledges 27 in the side walls and held in place by snapping the overhanging lips 101 and 100 over the upwardly extending edges 102 and 103 respectively, and to ensure that the edge 41 of the bottom wall of opening 33 seats against the lower surface of the ledge. The housing is then positioned over the strip 50 to locate the space between each two opposed partitions over the free ends 23 of the contact members. The assembly is then pushed down over the contact members until the laterally enlarged portion 21 of each contact member frictionally engages the bottom wall of the vertical grooves 15 in the partitions 7 within the housing. At this time, the free ends 23 of the contact members have each entered between a pair of projecting wall members 36 of the upper portion of the plate lever and behind the bilaterally extending portions 37. The housing is pushed downwardly until its bottom abuts the strip to complete the assembly. Although the strip 50 may be removed after assembly, it is preferably to retain it to prevent the thin terminal portions of the contacts from bending. The resilient bias of the contact members causes the plate lever to bear against the plate cam to in turn cause its cam surfaces to bear against the protrusions on the side walls. The plate cams 39 are inserted as shown in FIGS. 1, 2 and 3.

Because of the opening defined by the projecting wall members 36 as shown in FIGS. 1, 2 and 3 the individual contacts therein, such as contact 17, can be removed from the printed circuit board 50 without removing the housing 1. Specifically, the top 23 of the contact 17 is gripped by an appropriate tool (not shown) and then extracted from the printed circuit board 50 up through the housing. A new contact can then be inserted down through the opening in the housing 1 defined by the wall members 36 and pressed into the printed circuit board 50 by a tool (not shown).

It can be seen that the inner surfaces of the side walls 3 of FIGS. 2 and 3 present relatively plain surfaces without obstruction to the lances 19 of the contacts 17 as said contacts 17 are inserted into or withdrawn from the connector housing while the connector is mounted on the printed circuit board 50 in the manner shown in FIGS. 2 and 3. The insertion of an individual contact member 17 is made behind the retaining lateral extension 37, that is, between the lateral extension 37 and the outer wall 31. Since the portion 53 of the contacts 17 can be retained in aperture 51 in printed circuit board 50 by a frictional force rather than by solder, the removal and insertion of an individual contact member 17 can be effected without the necessity of soldering or unsoldering the contact member 17 from the circuit board 50. It is apparent that similar housing construction can be employed in connectors other than the one described herein to enable insertion or withdrawal of a single contact member from the substrate in which it is retained, and also from the connector housing, without removing the connector from the substrate or the housing from the contacts inserted in the circuit board.

Further, by employing various arrangements of cams and levers (not shown), as by attachment either permanently or temporarily to securing means (not shown) on the end wall 5 of the housing of FIG. 1, the cam plates 39 can be moved back and forth. While both cam plates 39 are shown as moving in the same direction to open the contacts, it is evident that by a simple design change the cam plates 39 can be made to move in opposite directions to open the contacts.

There has been disclosed a circuit board connector providing zero force entry and withdrawal capability which is simple and economical to manufacture and assembly and has few moving parts.

It is to be understood that the form of the invention shown and described herein is but a preferred embodiment thereof, and that various changes, such as for example, the number of inclined surfaces or cam sections, configuration of the contact members and other obvious changes which would readily occur to persons skilled in the art, can be made without departing from the scope or spirit of the invention as defined by the following claims.

What is claimed is:

1. A circuit board connector comprising:

an insulating rectangular housing having a base and first and second side walls mounted vertically thereon and substantially parallel to each other and open along one edge to form a passageway between said first and second side walls for edgewise insertion of a circuit board provided with contacts adjacent said open edge, stop wall means within the passageway spaced from said open edge of the housing and forming a stop for the edge of said circuit board, at least one row of elongated resilient laterally spaced contact members each having a first portion of its length secured within the housing and a free end portion extending beyond the stop wall means toward the open edge of the housing, said contact members being provided with a contact area intermediate said portions which is normally located in the path of movement of a circuit board in said passageway, a plate lever positioned outside said housing side walls and along the length thereof, cooperating means on said plate lever and one of said side walls of the housing for pivotally supporting said plate lever on the side wall for movement toward and away therefrom, said plate lever having a contact engaging portion overlying the open edge of the housing and constructed to capture the free end portions of the contact members to retract the contacts away from said passageway and away from said path of movement of said circuit board against their bias upon movement of said contact engaging portion of said plate lever outwardly away from the side wall, and actuating means movably located between the plate lever and said side wall for moving the contact engaging portion of said plate lever outwardly from said side wall.

2. A circuit board connector according to claim 1 wherein the cooperating means on the plate lever and side wall comprises, an unciform ledge projecting from said side wall near the base of said housing, said plate lever having an opening therein constructed to lock with said unciform ledge to form a pivotal connection between said housing side wall and said plate lever, said actuating means comprising an elongated rectangular plate cam with its width extending substantially between the ledge and said overlying portion of the plate lever for maintaining the locked connection between said unciform ledge and said plate lever opening and being longitudinally slidable between the plate lever and the side wall, said plate cam having a portion thereof between its ends tapering in thickness longitudinally thereof, and a protuberance on at least one of said plate lever or side wall cooperating with said tapered portion for moving the arm away from said side wall against the biasing force of the resilient contact members.

3. A circuit board connector according to claim 2 wherein the side wall is provided with a plurality of said unciform ledges in longitudinally spaced relation and said plate lever is provided with a plurality of said openings for respective cooperation with said unciform ledges.

4. A circuit board connector according to claim 3 wherein said plate cam is provided with a plurality of said tapered portions and at least one of said plate lever and side wall is provided with a plurality of protuberances for respectively abutting said tapered portions to move said plate lever outwardly upon slidable movement of the cam plate in a predetermined direction.

5. A circuit board connector according to claim 4 in which said overlying portion comprises:

a plurality of longitudinally spaced planar elements each extending from said lever portion between the free end portions of a pair of adjacent contact members, and bilateral extensions on the free ends of said planar elements extending between the free end portions of adjacent contact members and said passageway.

6. A circuit board according to claim 2 wherein said plate cam is provided with a plurality of said tapered portions and at least one of said plate lever or side wall is provided with a plurality of protuberances for respectively abutting said tapered portions to move said plate lever outwardly upon slidable movement of the cam plate in a predetermined direction.

7. A circuit board connector according to claim 1, wherein the overlying portion of the plate lever portion comprise, a plurality of longitudinally spaced planar elements each extending from said plate lever portion between the free end portions of a pair of adjacent contact member, and bilateral extensions on the free ends of said planar elements.

8. A circuit board connector according to claim 1 wherein the actuating means comprises an elongated plate cam slidably mounted for longitudinal movement between the plate lever or side wall and having a surface portion thereof tapered in depth longitudinally thereof, one of said side wall or plate lever being provided with a protuberance for cooperating with the tapered portion to move the arm outwardly against the bias of the contact members upon movement of the plate cam longitudinally in a predetermined direction.

9. A circuit board connector according to claim 1 wherein a third portion of each of the contact members protrudes from the end of the housing opposite to that provided with the recess and comprising a terminal for connection to external circuitry.

10. A circuit board connector comprising, an insulating rectangular housing having a base and first and second side walls mounted vertically thereon substantially parallel to each other and open at one edge to form a passageway for edgewise insertion of a circuit board provided with contacts adjacent said circuit board edge, stop wall means within the passageway spaced from said open edge of the housing and forming a stop for the edge of said circuit board, a pair of rows of resilient elongated laterally spaced contact members within the housing, each row being located within and on one side of the path of movement of a circuit board inserted in the passageway, said contact members each having a first portion of its length secured within the housing and a free end portion extending beyond the stop wall means toward the open edge of the housing and provided with a contact intermediate said portions normally located in said path, the respective contacts of opposite rows being in closely spaced confronting relation to each other, a pair of plate levers, cooperating means on each plate lever and a respective side wall for pivotally mounting each plate lever on one of said side walls for movement relatively inwardly toward and outwardly away from said side wall, each plate lever having a portion overlying the open end of the housing and constructed to capture the respective free end portions of the nearest row of said contact members to retract the contacts away from said passageway and out of said path upon movement of said plate lever outwardly away from the side wall to which said each plate lever is pivotally mounted, and actuating means movably located between said plate levers and the side walls to which they are mounted for moving the plate levers outwardly from said side walls.

11. A circuit board connector according to claim 10, wherein the cooperating means on each plate lever and its side wall comprises, an unciform ledge projecting from said side wall near the base of said housing, said plate lever having an opening therein constructed to lock with said unciform ledge to form a pivotal connection between said housing side wall and said plate lever, said actuating means comprising an elongated rectangular plate cam with its width extending substantially between the ledge and said overlying portion of the plate lever for maintaining the locked connection between said unciform ledge and said plate lever opening and being longitudinally slidable between the plate lever and the side wall, said plate cam having a portion thereof between its end tapering in thickness longitudinally thereof, and a protuberance on each of one of the plate levers and side walls cooperating with the respective tapered portion of each plate for moving the plate lever away from its corresponding side wall against the biasing force of the resilient contact members.

12. A circuit board connector according to claim 11 wherein each side wall is provided with a plurality of said unciform ledges in longitudinally spaced relation and each of said plate levers is provided with a plurality of said openings for cooperation with respective unciform ledges.

13. A circuit board connector according to claim 12 wherein each of said plate cams is provided with a plurality of said tapered portions and each of one of the plate levers and side walls is provided with a plurality of protuberances for engaging the tapered portions to move a plate lever outwardly when a plate cam is moved longitudinally in a predetermined direction.

14. A circuit board connector according to claim 13 in which said overlying portion comprises:

a plurality of longitudinally spaced planar elements each extending from said plate lever portion between the free end portions of a pair of adjacent contact members, and bilateral extensions on the free ends of said planar elements extending between the free end portions of adjacent contact members and said passageway.

15. A circuit board connector according to claim 11 wherein each of said plate cams is provided with a plurality of said tapered portions and each of one of the plate levers or side walls is provided with a plurality of protuberances for engaging the tapered portions to move a plate lever outwardly when a plate cam is moved longitudinally in a predetermined direction.

16. A circuit board connector according to claim 10, wherein the overlying portion of the plate lever comprises, a plurality of longitudinally spaced planar elements each extending from said plate lever portion between the free end portions of a pair of adjacent contact members, and bilateral extensions on the free ends of said planar elements extending between the free end portions of adjacent contact members and said passageway.

17. A circuit board connector according to claim 10, wherein the actuating means each comprises an elongated plate cam slidably mounted for longitudinal movement between each plate lever and its cooperating side wall, each plate cam having a surface portion thereof tapered in depth longitudinally thereof, each of one of said side walls or plate levers being provided with a protuberance for cooperating with the tapered portion to move an associated plate lever outwardly of its corresponding side wall against the bias of the contact members, when a plate cam is moved longitudinally in a predetermined direction.

18. A circuit board connector according to claim 10, wherein a third portion of each of the contact members protrudes from the opposite end of the housing.

19. A zero entry force connector for connecting to a plurality of external terminals positioned on the edge of a supporting member comprising:

a housing having a base portion and first and second side walls mounted vertically thereon and spaced apart a distance for insertion of said supporting member therebetween;

a plurality of contacts each having a first portion constructed to engage the edge of said supporting member, and a housing engaging portion and arranged in first and second parallel rows to form a single row of pairs of said contacts, with the housing engaging portions of each pair being mounted in said base portion and with their first portions extending out of said housing base and normally in the path of a supporting member being inserted therebetween;

said housing further comprising first and second plate means and connecting means flexibly securing said first and second plate means to said housing along the elongated length of said housing and outside said first and second side walls and with a portion thereof capturing said first portions of said contacts;

said first and second plate means further constructed to respond to a force of predetermined value and transverse thereto to pivot about said connecting means and move the captured first portions of said contacts out of the path of a supporting member being inserted therebetween;

actuator means positioned between said first plate means and said first side wall and between said second plate means and said second side wall;

cooperating camming surfaces formed on said actuator means, and said first and second plate means, or said first and second side walls, and constructed to respond to actuation of said actuating means to create said force of predetermined value to pivot said first and second plate means about said connecting means to move the captured first portions out of the path of said supporting member being inserted therebetween.

20. A zero entry force connector as in claim 19 in which:

a first camming surface on at least one of said actuator means, said first plate means or said first side wall is comprised of a series of first inclined surfaces; and in which a second camming surface on at least one of said actuator means, said plate means or said second side wall is comprised of a series of second inclined surfaces;

said first and second inclined surfaces each having a length greater than the distance between adjacent contacts in said row of contacts.

21. A zero entry connector as in claim 19 in which:

said first and second side walls define a slot therebetween for entry of the edge of said supporting member;

said slot being continuous along said housing and through at least one end of said housing.

22. A zero entry force connector for connecting to a plurality of external terminals positioned on the edge of a supporting member comprising:

a housing having a base portion and first and second side walls mounted vertically thereon and spaced apart a distance for insertion of said supporting member therebetween;

a plurality of contacts each having a first portion for engaging the edge of said supporting member, and a housing engaging portion and arranged in first and second parallel rows to form a single row of pairs of said contacts, with the housing engaging portions of each pair being mounted in said base portion and with their first portions extending out of said housing base and normally in the path of a supporting member being inserted therebetween;

said housing further comprising first and second plate means and connecting means flexibly securing said first and second plate means to said housing along the elongated length of said housing and outside said first and second side walls and with a portion thereof capturing said first portions of said contacts;

said first and second plate means further constructed to respond to a force greater than a predetermined value and transverse to said housing base portion to pivot about said connecting means and move the captured first portions of said contacts out of the path of a supporting member being inserted therebetween;

actuator means positioned between said first plate means and said first side wall and between said second plate means and said second side wall;

said actuator means, said first and second plate means or said first and second side walls having camming configurations on the surfaces thereof constructed to respond to actuation of said actuator means to move the contact engaging portion of said first and second plate means outwardly from said first and second side walls.

23. A zero entry force connector as in claim 22 in which:

at least a first of said camming surfaces on at least one of said actuator means, said first plate means or said first side wall is comprised of a series of first inclined surfaces; and in which at least a second of said camming surfaces on at least one of said actuator means, said plate means or said second side wall is comprised of a series of second inclined surfaces;

the inclined surfaces of each series of first and second inclined surfaces having a length greater than the distance between adjacent contacts in said row of contacts.

24. A zero entry force connector for connecting to a plurality of external terminals secured on a supporting member and comprising:

a housing comprising an elongated base portion and side wall means extending therefrom and defining at least one opening for receiving said external terminals;

a plurality of contacts each having a first portion comprising an external terminal engaging section, and a second portion for engaing said housing base portion and connected to said first portion, with the second portions being mounted in said elongated base portion and said first portions extending from said housing base portion into said at least one opening in the path of said external terminals when said external terminals are being inserted in said connector;

said housing further comprising plate means positioned outside said side wall means and connecting means flexibly connecting said plate means to said housing base portion along its elongated length and with a portion of said plate means capturing said first portions of said contacts;

said plate means further constructed to respond to a predetermined force transverse to said plate means to pivot about said connecting means to move the captured first portions of said contacts out of the path of said external terminals being inserted in said at least one opening in said connector;

actuator means positioned between said plate means and said side wall means;

said actuator means, said plate means and said side wall means comprises a camming configuration constructed to generate said force in response to the actuation of said actuator means to move the contact engaging portion of said plate means outwardly from said side wall means.

25. A connector as in claim 24 in which:

a first camming configuration on at least one of said actuator means, said first plate means or said first side wall is comprised of a series of first inclined surfaces; and in which a second camming configuration on at least one of said actuator means, said plate means or said second side wall is comprised of a series of second inclined surfaces;

the inclined surfaces of the series of first and second inclined surfaces each having a length greater than the distance between adjacent contacts in said row of contacts.

26. A connector as in claim 25 in which said at least one opening is continuous along said housing and extends through at least one end of said housing.

27. A zero entry force connector for connecting to a plurality of external terminals secured on a supporting member in at least one row and comprising:

a housing comprising an elongated base portion and side wall means mounted vertically thereon and defining a slot for receiving said supporting member;

a plurality of contacts each having a first portion for engaging said external terminals and a second portion for engaging said housing base portion connected to said first portion, and arranged in a row on said housing base portion, with the second portion of each contact being mounted in said housing base portion and said first portion extending from said housing base portions into said slot and normally in the path of said external terminals when said supporting member is being inserted in said connector;

said housing comprising first elongated plate means positioned outside said side wall means and connecting means flexibly connecting said first elongated plate means to said housing base portion along the elongated length of said housing with a portion of said first elongated plate means capturing said first portions of said contacts;

said first elongated plate means further constructed to respond to a force of predetermined value and transverse to said elongated plate means to pivot about said connecting means to move the captured first portions of said contacts out of the path of said external terminals being inserted in said connector;

actuator means positioned between said first elongated plate means and said side wall means; and cooperating camming surfaces formed on said actuator means and selectively on said first elongated plate means or said side wall means to pivot said first elongated plate means about said connecting means to move the captured first portions of said contacts out of the path of said supporting member being inserted therebetween.

28. A connector as in claim 27 in which:

a first of said camming surfaces on at least one of said actuator means, said first plate means or said first side wall is comprised of a series of first inclined surfaces; and in which a second of said camming surfaces on at least one of said actuator means, said plate means or said second side wallis comprised of a series of second inclined surfaces;

the camming surfaces of the series of first and second inclined surfaces each having a length greater than the distance between adjacent contacts in said row of contacts.

29. A connector as in claim 27 in which said slot is continuous along said housing and extends through at least one end of said housing.

* * * * *